(12) United States Patent
Juengling (10) Patent No.: US 7,824,983 B2
(45) Date of Patent: Nov. 2, 2010

(54) METHODS OF PROVIDING ELECTRICAL ISOLATION IN SEMICONDUCTOR STRUCTURES

(75) Inventor: Werner Juengling, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/131,608

(22) Filed: Jun. 2, 2008

(65) Prior Publication Data
US 2009/0294840 A1   Dec. 3, 2009

(51) Int. Cl.
*H01L 21/336*   (2006.01)
*H01L 21/335*   (2006.01)

(52) U.S. Cl. .................. 438/270; 438/197; 438/142; 257/E21.54

(58) Field of Classification Search .............. 438/218, 438/445, 197, 431, 270, 142; 257/327, 522, 257/E21.54, E29.001
See application file for complete search history.

(56) References Cited

U.S. PATENT DOCUMENTS 5,972,776 A * 10/1999 Bryant ................. 438/440
6,265,282 B1 * 7/2001 Lane et al. ................. 438/424
7,098,105 B2 * 8/2006 Juengling ................. 438/257
2006/0046407 A1   3/2006 Juengling
2006/0216894 A1   9/2006 Parekh et al.
2006/0258109 A1   11/2006 Juengling
2007/0134884 A1   6/2007 Kim et al.
2008/0121970 A1   5/2008 Aritome

OTHER PUBLICATIONS

International Search Report for International Application No. PCT/US2009/045417 mailed Jan. 14, 2010, 4 pages.
International Written Opinion for International Application No. PCT/US2009/045417 mailed Jan. 14, 2010, 8 pages.

* cited by examiner

*Primary Examiner*—Thomas L Dickey
*Assistant Examiner*—Nikolay Yushin
(74) *Attorney, Agent, or Firm*—TraskBritt (57) ABSTRACT

Methods of isolating gates in a semiconductor structure. In one embodiment, isolation is achieved using a spacer material in combination with fins having substantially vertical sidewalls. In another embodiment, etch characteristics of various materials utilized in fabrication of the semiconductor structure are used to increase an effective gate length ("$L_{effective}$") and a field gate oxide. In yet another embodiment, a V-shaped trench is formed in the semiconductor structure to increase the $L_{effective}$ and the field gate oxide. Semiconductor structures formed by these methods are also disclosed.

12 Claims, 7 Drawing Sheets

METHODS OF PROVIDING ELECTRICAL ISOLATION IN SEMICONDUCTOR STRUCTURES

FIELD OF THE INVENTION

Embodiments of the invention relate to fabricating semiconductor structures. Specifically, embodiments of the present invention relate to methods of fabricating semiconductor structures exhibiting improved electrical isolation, and semiconductor structures having the same.

BACKGROUND OF THE INVENTION

Integrated circuit ("IC") designers desire to increase the level of integration, or density, of features within an IC by reducing the size of individual features and by reducing the separation distance between adjacent features on a semiconductor substrate. The continual reduction in feature size places ever-greater demands on techniques used to form the features, such as photolithography. This trend in increasing integration is also accompanied by a corresponding decrease in feature dimensions, which makes electrical isolation of the features an important aspect in fabricating semiconductor structures or semiconductor devices.

The trend is of particular relevance in the manufacture of memory devices, such as dynamic random access memory ("DRAM") memory devices. A typical memory cell, such as a DRAM cell, includes a transistor and a memory storage structure, such as a capacitor. Semiconductor devices typically include large numbers of DRAM cells. As the dimensions of individual memory cells in a DRAM array shrink, adjacent or neighboring gates become closer together and the need for efficient and reliable isolation processes to separate active regions, such as the transistors, of the DRAM cell dramatically increases. Known fabrication processes for producing memory cells and other devices having sub-micron dimensions have become increasingly inefficient. One method of isolating the transistors of the DRAM cell is to form a trenched isolation region between adjacent active regions of the DRAM cell. The trenched isolation region typically includes a trench or cavity formed within the substrate and filled with an insulative material, such as silicon dioxide ("$SiO_2$"). The trenched isolation region is typically formed between neighboring transistors. However, as feature sizes continue to decrease, electrical operation of the transistors becomes more difficult. One contributing factor to this difficulty is known as the so-called "short channel effect" in which the width of the transistor channel becomes excessively small due to miniaturization, which results in the transistor activating even if a threshold voltage ("$V_t$") has not been applied to the gate. Another method of providing isolation is to appropriately dope the memory device. However, depending on the structure of the memory device, effective doping may be costly or may not be possible.

One example of a transistor that has been developed to overcome the short channel effect of a conventional transistor by forming a wider channel in the same horizontal space is a recessed access device ("RAD") transistor. One example of a RAD transistor includes a transistor gate (wordline), which is partially formed within a trench in a semiconductor substrate. The channel region is formed along the entire surface of the trench which, in effect, provides a wider channel without increasing the lateral space required by the transistor.

Memory device structures and methods of forming memory device structures are also described in U.S. Pat. No. 7,098,105 to Juengling and United States Patent Application Publication No. 2006/0046407 to Juengling, each of which is assigned to the assignee hereof and the disclosure of each of which is incorporated by reference herein in its entirety. The memory device structure includes a gateline lattice surrounding a plurality of source/drain regions. A gateline material forms the gateline lattice and the source/drain regions form an array with repeating regions spaced from one another by segments of the gateline lattice. The memory device structure is incorporated into a DRAM array by forming digit lines over and in electrical connection with some of the source/drain regions and by forming a plurality of capacitors in electrical connection with some of the source/drain regions. The memory device structure includes a substrate, a pair of so-called "pedestals," "pillars," or "fins" of semiconductor material, the gateline material located between the pedestals, and a gate dielectric material. One of the pedestals corresponds to the source/drain region utilized to electrically connect to the digit line, and the other pedestal corresponds to the source/drain region utilized to electrically connect to the capacitor. The gateline material between the pedestals functions as a transistor gate of a transistor device, which gatedly connects the source/drain region associated with one of the pedestals with the source/drain region associated with the other pedestal.

Figure 1:
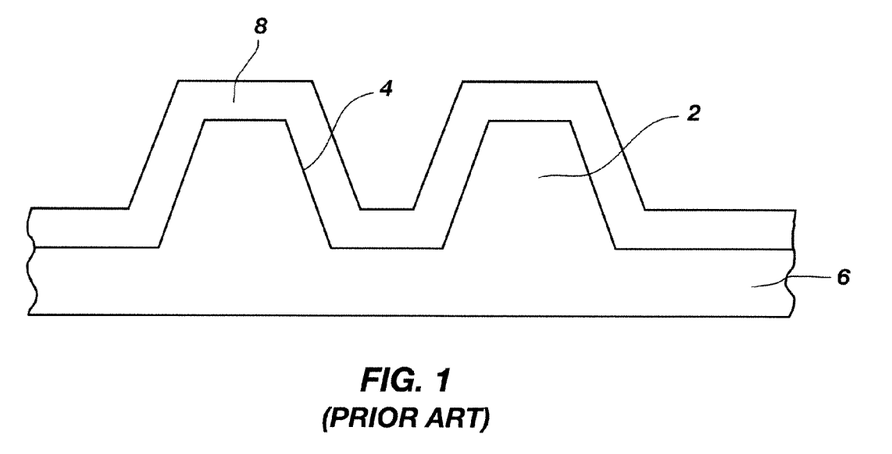
FIG. 1 is a cross-sectional view of a conventional memory device structure.

During fabrication of the memory device structures described in U.S. Pat. No. 7,098,105 and United States Patent Application Publication No. 2006/0046407, etch processes are used to form openings in the substrate. The gateline material is subsequently deposited in the openings. At larger feature dimensions, the etch process is capable of forming openings having substantially vertical sidewalls. However, as the feature dimensions decrease, the etch process is not capable of forming openings having substantially vertical sidewalls. Rather, as the feature dimensions continue to decrease, the fabrication processes described in U.S. Pat. No. 7,098,105 and United States Patent Application Publication No. 2006/0046407 may form pedestals or fins 2 in the substrate 6 having sloped sidewalls 4, as shown in FIG. 1. Since a substantially vertical etch of the substrate 6 is no longer possible when forming features having smaller dimensions, the sloped sidewalls 4 of the fins 2 are caused by forming the openings having sloped sidewalls. When the gateline material 8 is conformally deposited in these openings to form the gates, the deposited gateline material 8 also has sloped sidewalls, which reduces isolation and causes shorting between the gates. Fins 2 having sloped sidewalls of as little as 5°-6° may cause isolation and shorting problems.

Thus, there is a need in the art for developing fabrication processes to produce semiconductor structures similar to those described in U.S. Pat. No. 7,098,105 and United States Patent Application Publication No. 2006/0046407, but exhibiting improved isolation and reduced or eliminated shorting problems, for utilization in memory device structures.

BRIEF DESCRIPTION OF THE SEVERAL VIEWS OF THE DRAWINGS

While the specification concludes with claims particularly pointing out and distinctly claiming that which is regarded as the present invention, the advantages of this invention may be more readily ascertained from the following description of the invention when read in conjunction with the accompanying drawings in which:

DETAILED DESCRIPTION OF THE INVENTION

Semiconductor structures exhibiting improved isolation between features are disclosed, as are methods of forming such semiconductor structures. In one embodiment, isolation is achieved using a spacer material in combination with fins having substantially vertical sidewalls. In another embodiment, etch characteristics of different materials utilized in fabrication of the semiconductor structure are used to increase the effective gate length ("$L_{effective}$") and the field gate oxide. In yet another embodiment, a V-shaped trench is formed in the semiconductor structure to increase the $L_{effective}$ and the field gate oxide. The features formed in the semiconductor structure may include, but are not limited to, isolation regions, gates, or three-dimensional transistors. The features have a size of from approximately 20 nm to approximately 60 nm.

The following description provides specific details, such as material types, etch chemistries, and processing conditions, in order to provide a thorough description of embodiments of the present invention. However, a person of ordinary skill in the art will understand that the embodiments of the present invention may be practiced without employing these specific details. Indeed, the embodiments of the present invention may be practiced in conjunction with conventional fabrication techniques and etching techniques employed in the industry. In addition, the description provided below does not form a complete process flow for manufacturing a semiconductor device, and the semiconductor structures described below do not form a complete semiconductor device. Only those process acts and structures necessary to understand the embodiments of the present invention are described in detail below. Additional acts to form complete semiconductor devices from the semiconductor structures may be performed by conventional fabrication techniques. Furthermore, the illustrations included herein are not drawn to scale and are not meant to be actual views of any particular semiconductor structure or semiconductor device. Rather, the illustrations are merely idealized representations that are employed to describe the present invention. Additionally, elements common between illustrations may retain the same numerical designation.

The methods described herein may be used to form semiconductor structures to be used in memory devices, such as RADs, FinFETs, saddle FETs, nanowires, three-dimensional transistors, as well as other three-dimensional structures, such structures having utility in static memory such as SRAM, dynamic memory in the form of DRAM, extended data out (EDO) memory extended data out dynamic random access memory ("EDO DRAM"), synchronous dynamic random access memory ("SDRAM"), double data rate synchronous dynamic random access memory ("DDR SDRAM"), synchronous link dynamic random access memory ("SLDRAM"), video random access memory ("VRAM"), Rambus dynamic random access memory ("RDRAM"), Flash memories, or any other memory type devices known in the art. Moreover, the methods may also be used in other applications where improved gate isolation is desired. The semiconductor devices incorporating such structures may be used in wireless devices, personal computers, or other electronic devices, without limitation. While the methods described herein are illustrated in reference to specific DRAM device layouts, the methods may be used to form DRAM devices having other layouts.

Figure 2:
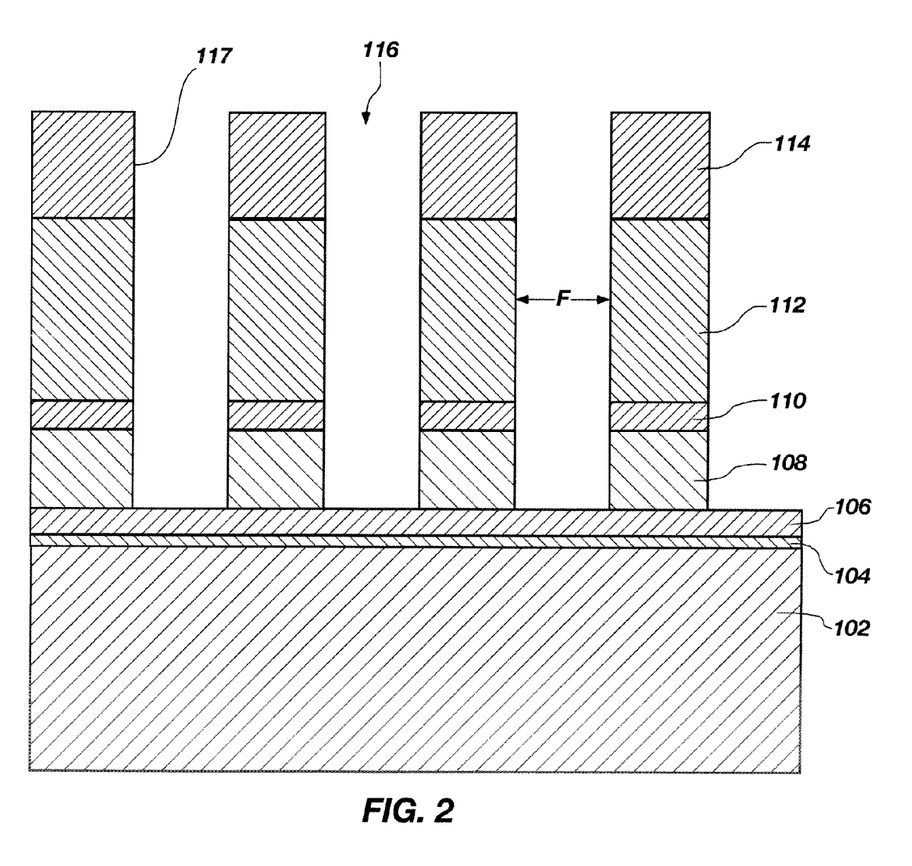
FIGS. 2-9 are cross-sectional views of embodiments of semiconductor structures of the present invention during various stages of fabrication.

In one embodiment, a spacer material is used in combination with a substantially vertical etch of materials overlying a substrate to form self-aligned features in or on the substrate. As used herein, the term "self-aligned" means and includes using a single photomask to form an initial pattern upon which other features are based. As such, multiple features formed on the semiconductor substrate are aligned without utilizing additional masking and photolithography acts. To form a semiconductor structure 134A (see FIG. 8) having improved isolation, a plurality of materials may be formed on a substrate 102 and patterned, as shown in FIG. 2. As used herein, the term "substrate" refers to a conventional silicon substrate or other bulk substrate having a layer of semiconductive material. As used herein, the term "bulk substrate" includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, or indium phosphide. By way of non-limiting example, the substrate 102 may be silicon, such as polysilicon. The substrate 102 may be conductively doped, either as-deposited (i.e., in situ doped) or doped during subsequent process acts with one or more suitable implants. By way of non-limiting example, the substrate 102 may be an intrinsically doped, monocrystalline silicon wafer.

The materials of structures according to embodiments of the invention may be formed on the substrate 102 by any suitable deposition technique including, but not limited to, spin coating, blanket coating, chemical vapor deposition ("CVD"), atomic layer deposition ("ALD"), plasma enhanced ALD, or physical vapor deposition ("PVD"). Alternatively, the materials may be grown Depending on the nature of a specific material to be formed on the substrate 102, the technique for depositing or growing the material may be selected by a person of ordinary skill in the art. While the materials may be formed on the substrate 102 as layers, the materials may also be formed in other configurations.

An oxide material 104 may, optionally, be deposited on the substrate 102. The oxide material 104 may be a silicon oxide, such as tetraethylorthosilicate ("TEOS"), silicon dioxide ("$SiO_2$"), or a high density plasma ("HDP") oxide. The oxide material 104 may be thermally grown on the substrate 102. By way of non-limiting example, the oxide material 104 may have a thickness of approximately 33 Å. By way of non-limiting example, the oxide material 104 is $SiO_2$ and is thermally grown on the substrate 102. While oxide material 104 is illustrated in FIGS. 2-7, the presence of oxide material 104 is optional. If present, the oxide material 104 may provide stress relief.

A nitride material 106 may be deposited on the oxide material 104. The nitride material 106 may be any nitride that is capable of being deposited at a high temperature including, but not limited to, silicon nitride ("$Si_3N_4$"). By way of non-limiting example, the nitride material 106 may be deposited at a thickness of approximately 150 Å. Forming the nitride material 106 on the oxide material 104, rather than on the substrate 102, may enable the nitride material 106 to be easily removed. Since forming the nitride material 106 on the substrate 102 may cause electrically active interface charges to form, forming the nitride material 106 on the oxide material 104 may reduce formation of these charges. An oxide pillar material 108 may be deposited on the nitride material 106. The oxide pillar material 108 may be one of the silicon oxide materials previously described for use as the oxide material 104. As such, the oxide material 104 and the oxide pillar material 108 may be formed from the same or different materials. By way of non-limiting example, the oxide pillar material 108 is a HDP oxide. An etch stop material 110 may be formed on the oxide pillar material 108. The etch stop material 110 may be deposited at a thickness of from approximately 150 Å to approximately 1000 Å. At greater thicknesses, such as at a thickness of greater than approximately 500 Å, the etch stop material 110 may function as an effective etch stop during chemical-mechanical planarization ("CMP") of overlying materials. The etch stop material 110 may be a nitride material, such as one of the materials described above for use as the nitride material 106. As such, the nitride material 106 and the etch stop material 110 may be formed from the same or different materials. A polysilicon material 112 may be deposited over the etch stop material 110. By way of non-limiting example, the polysilicon material 112 may be deposited at a thickness of approximately 2000 Å.

A hard mask material 114 may be deposited over the polysilicon material 112. The hard mask material 114 may be a carbon-containing material, a dielectric antireflective coating ("DARC"), or a bottom antireflective coating ("BARC") material. By way of non-limiting example, the hard mask material 114 may be transparent carbon ("TC"), amorphous carbon ("AC"), TEOS, polycrystalline silicon ("polysilicon"), $Si_3N_4$, silicon oxynitride ($SiO_3N_4$), silicon carbide (SiC), $SiO_2$, or combinations thereof. By way of non-limiting example, the hard mask material 114 may be deposited at a thickness of approximately 2000 Å. The oxide material 104, nitride material 106, oxide pillar material 108, etch stop material 110, polysilicon material 112, and hard mask material 114 may be formed on the substrate 102 by conventional techniques.

A photoresist material (not shown) may be deposited over the hard mask material 114, patterned, and developed by conventional, photolithographic techniques. To produce the pattern shown in FIG. 2, a reticle (not shown) having a corresponding pattern may be produced and used to pattern the photoresist material, as known in the art. Since photoresist materials and photolithographic techniques are known in the art, selecting, depositing, patterning, and developing the photoresist material to produce the desired pattern are not discussed in detail herein. The pattern in the photoresist material may include spaces and lines having substantially equal widths. The width of the spaces and lines may be a minimum feature size ("F") printable by the photolithography technique used to form the pattern. Alternatively, the spaces and lines may be printed at a feature size greater than F. By way of non-limiting example, F is approximately 66 nm. The pattern in the photoresist material may be transferred into the underlying materials by etching the underlying materials, as known in the art. The pattern may be transferred into the hard mask material 114, the polysilicon material 112, the etch stop material 110, the oxide pillar material 108, and at least partially into the nitride material 106, forming first trench 116. The first trench 116 may have a feature size of F.

The pattern may be etched into the underlying materials using a conventional etch process, such as a conventional dry etch process, a conventional wet etch process, or combinations thereof. By way of non-limiting example, a dry etch chemistry may be used to etch the underlying materials, producing the first trench 116 having substantially vertical sidewalls 117. As used herein, the term "substantially vertical sidewalls" means and includes sidewalls having a slope angle of less than approximately 5° to the vertical. As such, portions of the oxide pillar material 108, etch stop material 110, polysilicon material 112, and hard mask material 114 remaining after the etch process may have substantially vertical sidewalls. A single dry etch chemistry may be used to transfer the pattern into the materials underlying the photoresist material, or multiple dry etch chemistries may be used to separately etch each of the materials underlying the photoresist material. Etch chemistries suitable for etching these materials are known in the art and, therefore, are not described in detail herein. Remaining portions of the photoresist material overlying these materials may be removed, as known in the art.

Figure 3:
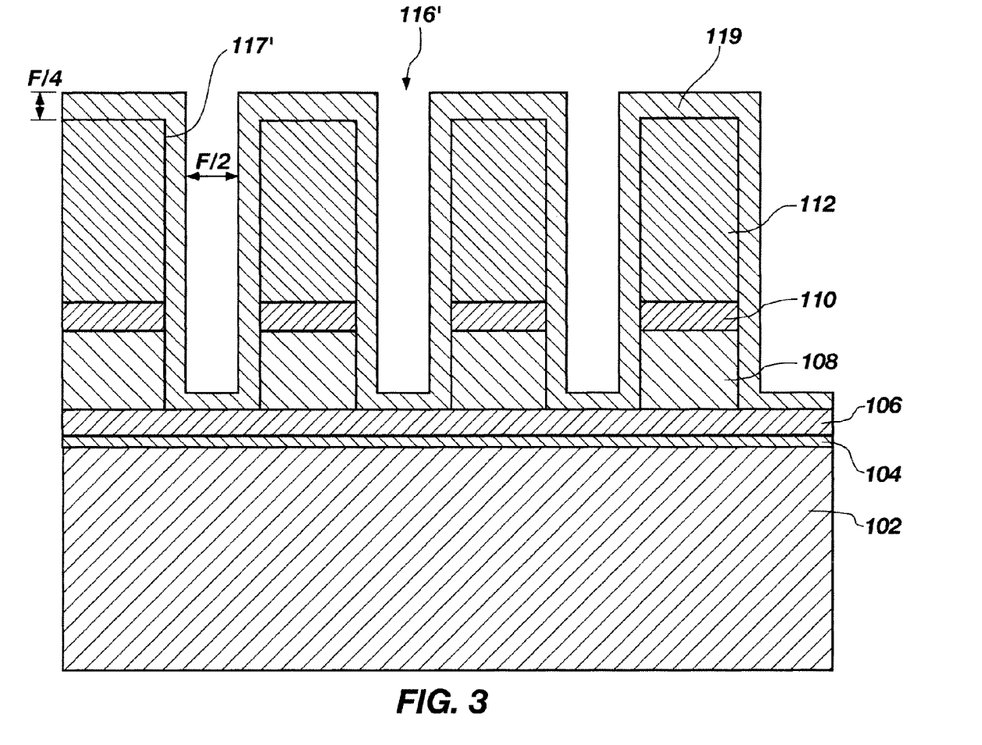

A spacer material 119 may be conformally deposited into the first trench 116, as shown in FIG. 3. By way of non-limiting example, the spacer material 119 may be polysilicon or a nitride, such as $Si_3N_4$. The spacer material 119 may be conformally deposited at a thickness of F/4, narrowing the width of the first trench 116 from F to F/2. By way of non-limiting example, the spacer material 119 may be deposited at a thickness of from approximately 100 Å to approximately 200 Å, such as at a thickness of approximately 150 Å. The narrowed, first trench 116' is illustrated in FIG. 3. By way of non-limiting example, if the first trench 116 has a width of approximately 66 nm, the width of the narrowed, first trench 116' is reduced to approximately 33 nm after depositing the spacer material 119 at a thickness of 16.5 nm. Conformal deposition of the spacer material 119 may maintain the substantially vertical sidewalls 117' of the narrowed, first trench 116'.

Figure 4:
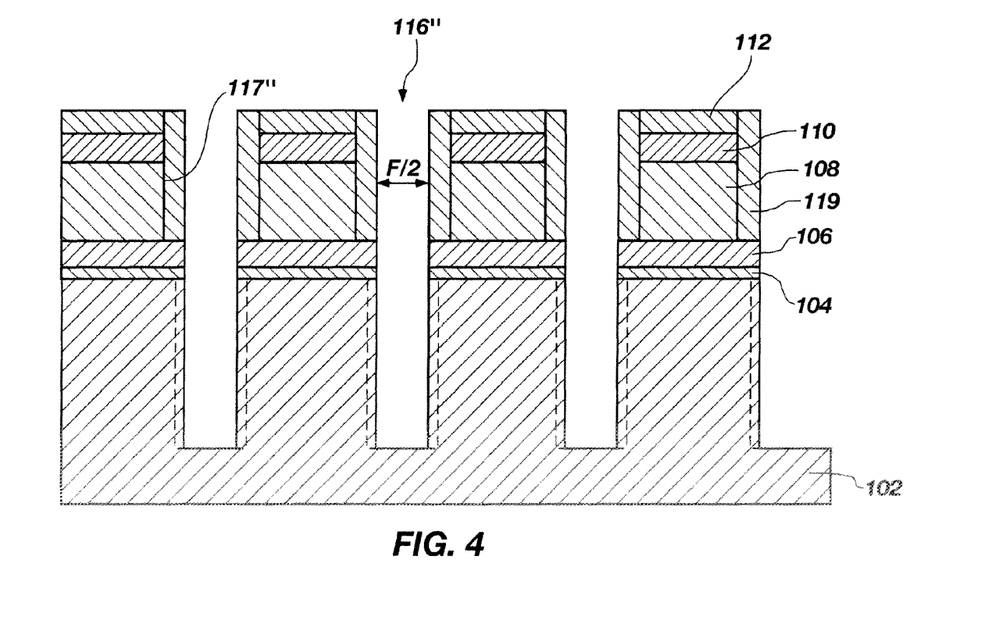

The depth of the narrowed, first trench 116' may be extended through the nitride material 106 and oxide material 104 and into the substrate 102, as shown in FIG. 4, forming first trench 116". The depth of the narrowed, first trench 116' may be extended using an isotropic etchant. By way of non-limiting example, the first trench 116" may be formed by dry etching the nitride material 106, oxide material 104, and substrate 102. The substantially vertical sidewalls 117" of the first trench 116" may be maintained during the etch. As such, the portions of the first trench 116" in the substrate 102 may also have substantially vertical sidewalls. In addition to etching these materials, the isotropic etchant may also etch horizontal portions of the spacer material 119 and at least a portion of the polysilicon material 112. The polysilicon material 112 and spacer material 119 may be etched by an amount substantially identical to the amount of the nitride material 106, oxide material 104, and substrate 102 that is etched. During the etch process, the spacer material 119 may remain adjacent to the polysilicon material 112, the etch stop material 110, the oxide pillar material 108, and the nitride material 106.

By way of non-limiting example, the dry etchant may be a plasma etch, such as a $CF_4$-containing plasma, a $CHF_3$-containing plasma, a $CH_2F_2$-containing plasma, or mixtures thereof. The depth of the first trench 116" may be approximately 2000 Å. Features ultimately formed in the first trench 116" may include, but are not limited to, isolation regions, gates, or three-dimensional transistors. By way of non-limiting example, isolation oxide regions 132 are formed in the first trench 116" (see FIG. 8). As such, the first trench 116" is also referred to herein as an isolation trench. The isolation oxide regions 132 isolate cells from other cells or rows from other rows in the semiconductor structure 134A. As described below, portions of the substrate 102 beneath the portions of the polysilicon material 112, etch stop material 110, oxide pillar material 108, nitride material 106, and oxide material 104 remaining after the etch process may correspond to fins 130 of the semiconductor structure 134A (see FIG. 8).

Figure 7:
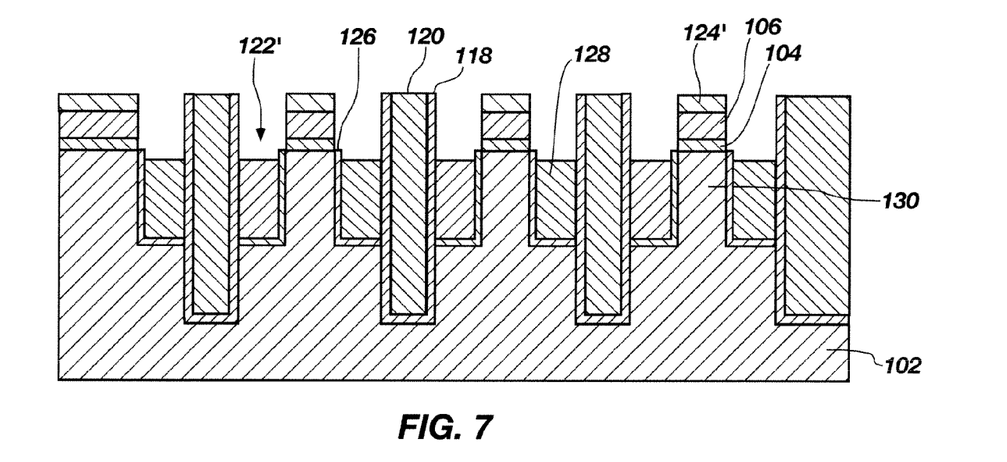

The dry etch used to produce the first trench 116" may undercut portions of the substrate 102, as shown by dashed lines in FIG. 4. While the undercutting is not illustrated in subsequent drawings for simplicity, the undercutting may be present. As discussed in more detail below, this undercutting of the substrate 102 may desirably prevent the formation of slivers of silicon between first trench 116" (isolation trenches) and second trench 122' (recessed access device or "RAD" trenches) during subsequent processing. As used herein, the term "RAD trench" means and includes an opening in the substrate 102 in which a wordline is ultimately to be formed. The second trench 122' is shown in FIG. 7. To further increase the oxidation differential between the spacer material 119 and the substrate 102, the spacer material 119 may be doped with n-type or p-type impurities.

Figure 5:
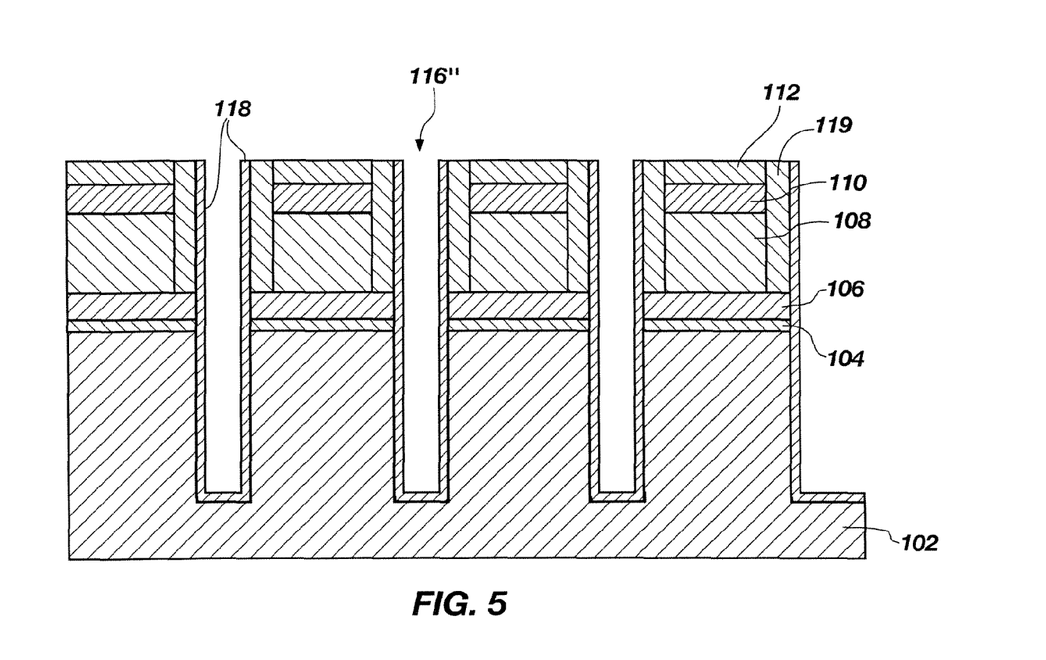
Figure 6:
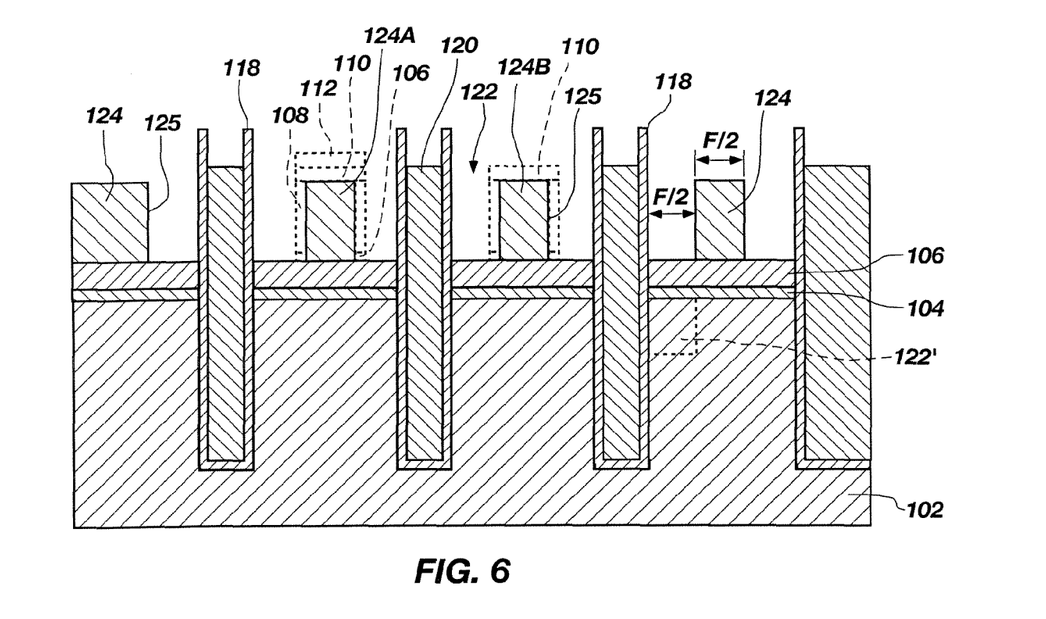

As shown in FIG. 5, a liner 118 may be deposited in the first trench 116" before depositing a fill material in the first trench 116". The liner 118 may be formed from an oxide or a nitride, and may be deposited by conventional techniques. By way of non-limiting example, the liner 118 is formed from an oxide, such as TEOS. The liner 118 may contact the sidewalls of the first trench 116". The first trench 116" may be filled with a fill material 120, as shown in FIG. 6. The fill material 120 may be a dielectric material, such as a spin-on-dielectric ("SOD"), silicon dioxide, TEOS, or a HDP oxide. The first trench 116" may be filled by conventional techniques, such as by blanket deposition of the fill material 120. In addition to filling the first trench 116", the dielectric material may be formed over the spacer material 119 and polysilicon material 112. As known in the art, the fill material 120 may be densified and doped with an impurity, such as boron, forming shallow trench isolation ("STI") regions (which correspond to the isolation oxide regions 132 shown in FIG. 8). The doping may be conducted in additional processing acts during the etch acts described above, or in additional processing acts conducted after the etch acts described above. The doping may be conducted using any suitable doping process including, but not limited to, ion implantation or diffusion. By way of non-limiting example, the liner 118 is a nitride material and the fill material 120 is $SiO_2$.

The fill material 120 may be planarized, such as by chemical-mechanical polishing ("CMP"), to remove portions of the fill material 120 extending above the liner 118 and the spacer material 119. As such, upper surfaces of the liner 118 and the spacer material 119 may be exposed. The spacer material 119 may be removed by wet etching or dry etching, exposing lateral surfaces of the nitride material 106, oxide pillar material 108, etch stop material 110, and polysilicon material 112. Removing the spacer material 119 creates a gap or void where the spacer material 119 was previously located. By way of non-limiting example, if the spacer material 119 is formed from polysilicon, the spacer material 119 may be etched using a solution of tetramethylammonium hydroxide (TMAH). Alternatively, if the spacer material 119 is formed from a nitride, the spacer material 119 may be removed using a dry etch chemistry. During the removal of the spacer material 119, the nitride material 106, oxide pillar material 108, and liner 118 function as etch stops. However, portions of the fill material 120 in the first trench 116" may be recessed such that portions of the liner 118 extend above an upper surface of the fill material 120. Removal of the spacer material 119 provides a trench (first trench 116) that is capable of being used to shift the critical dimension ("CD") of the features in the substrate 102.

The gap created by removing the spacer material 119 may be enlarged by subjecting exposed surfaces of the materials surrounding the gap to an etchant. The polysilicon material 112 and the etch stop material 110 overlying the oxide pillar material 108 may be etched, such as by using a wet etchant. The wet etchant may also laterally etch portions of the oxide pillar material 108 and the nitride material 106, producing second trench 122 and oxide pillar 124, as shown in FIG. 6. The second trench 122 may be formed in the oxide pillar material 108 and at least partially into the nitride material 106. FIG. 6 illustrates the resulting structure after multiple process acts described above have been conducted. For clarity, the previous locations of the polysilicon material 112, the etch stop material 110, the oxide pillar material 108, and the nitride material 106 are indicated by the dashed lines around oxide pillar 124A. The liner 118 and nitride material 106 may prevent the wet etchant from removing the fill material 120 in the first trench 116" and from removing portions of the substrate 102. By way of non-limiting example, the wet etchant may be hydrogen fluoride (HF). While a single wet etchant may be used to remove the polysilicon material 112 and the etch stop material 110 and to laterally etch the oxide pillar material 108, multiple etchants may be used to separately remove these materials. Alternatively, a wet etchant selective for the oxide pillar material 108 and the nitride material 106 relative to the etch stop material 110 may be introduced into the gap created by removing the spacer material 119. The wet etchant may undercut the oxide pillar material 108 and the nitride material 106 while the etch stop material 110 remains substantially intact, as indicated by the dashed lines around oxide pillar 124B. After removing the etch stop material 110, the second trench 122 and oxide pillar 124 may be substantially as shown in FIG. 6. Alternatively, a dry etchant may be used to enlarge the gap created by removing the spacer material 119.

While removing the polysilicon material 112, the etch stop material 110, and portions of the oxide pillar material 108 and nitride material 106 may be conducted as previously described, additional processing acts may be contemplated to produce the second trench 122 and oxide pillar 124. The etch conditions used to form the oxide pillar 124 may produce substantially vertical sidewalls 125 of the oxide pillar 124. Each of the second trench 122 and oxide pillar 124 may have a width of F/2. The width of the second trench 122 may correspond to the width of a gate 129 ultimately formed in the substrate 102 (see FIG. 8). The width of the oxide pillar 124 may correspond to the width of a fin 130 ultimately formed in the substrate 102 (see FIG. 8).

As shown in FIG. 7, the oxide pillar 124 may be used as a hard mask to extend the depth of second trench 122, forming second trench 122' in the substrate 102. The second trench 122' is shown using dashed lines in FIG. 6 and in FIG. 7 partially filled with a gate material 128. Since the oxide pillar 124 has substantially vertical sidewalls 125, sidewalls of the second trench 122' in the substrate 102 may also be substantially vertical. In addition, remaining portions of the substrate 102 below the oxide pillar 124, which correspond to fin 130 ultimately formed in the substrate 102 (see FIG. 8), may have substantially vertical sidewalls. The second trench 122' may be formed by dry etching exposed portions of the oxide material 106 and the nitride material 104 and the substrate 102. During this etch, the fill material 120, the liner 118, and the oxide pillar 124 may be etched by an amount substantially identical to the amount of the oxide material 106, the nitride material 104, and the substrate 102 that are etched. As such, upper surface of the fill material 120 and the liner 118 may be substantially coplanar with an upper surface of the remaining portion of the oxide pillar 124'. The second trench 122' may have a depth of approximately 1200 Å. Second trench 122' may correspond to a RAD trench located on both sides of the fin 130. Features formed in the second trench 122' may include, but are not limited to, isolation regions, gates, or three-dimensional transistors. By way of non-limiting example, gates 129 are formed in the second trench 122' (see FIG. 8). A gate oxide 126, such as $SiO_2$, may be formed along sidewalls and a bottom horizontal surface of the second trench 122'. The second trench 122' may be filled with the gate material 128, such as titanium nitride. Portions of the gate material 128 overlying the liner 118, the fill material 120, and the oxide pillar 124' may be removed, such as by CMP or other conventional technique. In addition, a portion of the gate material 128 remaining in the second trenches 122' may be removed, recessing the gate material 128 below an upper surface of the gate oxide 126. By way of non-limiting example, the gate material 128 may be recessed approximately 150 Å below the upper surface of the gate oxide 126. While depositing the gate material 128, removing portions of the gate material 128 by CMP, and recessing portions of the gate material 128 may be conducted as described above, various other processing acts may be contemplated to produce the structure shown in FIG. 7.

Figure 8:
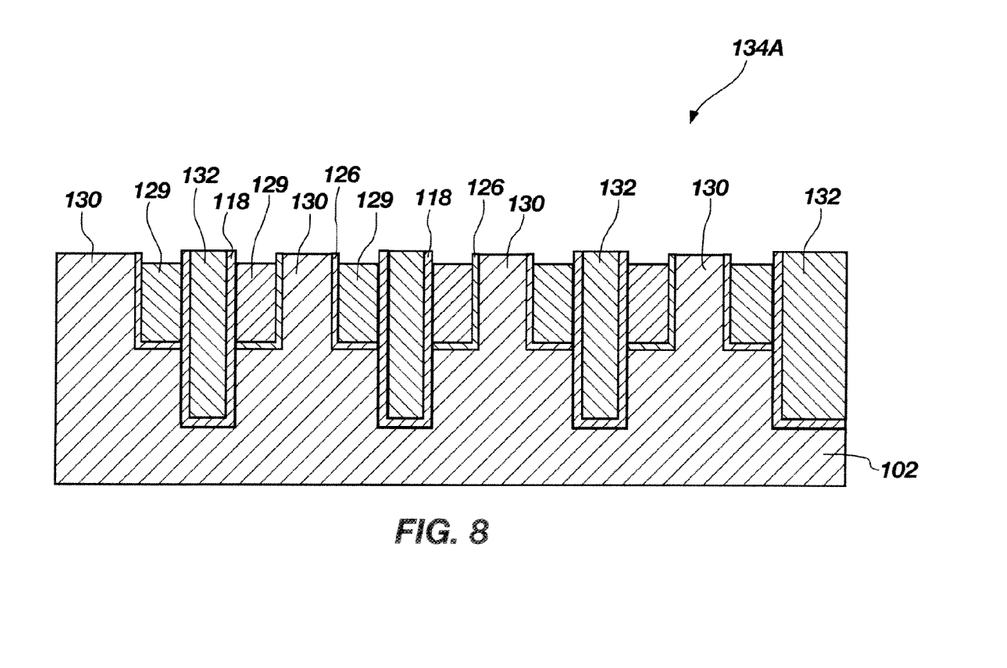

The oxide pillar 124', nitride material 106, and oxide material 104 remaining over the substrate 102 may be removed and a nitride material (not shown) may be deposited over the gate material 128 to prevent oxidation, producing semiconductor structure 134A as shown in FIG. 8. The oxide pillar 124', nitride material 106, and oxide material 104 may be removed by conventional techniques to form the semiconductor substrate 134A shown in FIG. 8. The semiconductor structure 134A may include at least one gate 129, at least one fin 130, and at least one isolation oxide region 132. The semiconductor structure 134A may be subjected to further processing, as known in the art, to produce a desired memory device, such as a DRAM. Since the formation of memory devices is known in the art, the further processing is not described in detail herein. As known in the art, portions of the substrate 102, including portions of the fin 130, may be implanted with an appropriate dopant(s) to create channel and source/drain regions. The substrate 102 may be doped using any suitable doping process, such as ion implantation or diffusion. As known in the art, the substrate 102 may be doped at one or more stages of the processing acts described above. By way of non-limiting example, diffusion regions of the substrate 102 may be formed by conventional techniques to provide electrical connection with doped regions of the fins 130. Since implantation techniques are known in the art, doping of the substrate 102 is not described in detail herein.

By way of non-limiting example, the semiconductor structure 134A may be used in a memory device having two gates 129, such as a two-sided FinFET. The gates 129 may control access transistors, which are isolated from neighboring access transistors by isolation oxide regions 132. Metal/metal isolation between gates 129 is provided by the isolation oxide regions 132, while the boron implantation into the isolation oxide regions 132 may provide electrical bulk isolation between the gates 129. The fins 130 form portions of the transistors. Since the fins 130 have substantially vertical sidewalls, when the gate material 128 is deposited in the second trenches 122' (FIG. 7) to form the gates 129, the gates 129 are isolated and shorting between adjacent gates 129 is substantially reduced or eliminated. Similar methodology to that described above may also be used in additional applications. By way of non-limiting example, the semiconductor structure 134A may be used in producing a two-vertical transistor or a one-capacitor $4F^2$ DRAM cell.

Numerous advantages are achieved by utilizing the process described above to form semiconductor structure 134A. By utilizing the spacer material 119 in combination with a substantially vertical etch of the polysilicon material 112 and the oxide pillar material 108, features formed in the substrate 102 may be self-aligned and have a substantially equal width. For instance, gates 129 on either side of a particular fin 130 may have substantially equal widths. Since the features are self-aligned, the semiconductor structure 134A may be formed using one photolithography act, which saves costs and additional photolithography acts. The process described herein also provides additional stability to semiconductor structures formed during the process because the fins 130 have a width of F. In contrast, fins produced by the processes described in U.S. Pat. No. 7,098,105 and United States Patent Application Publication No. 2006/0046407 have a width of ½ F and, therefore, may be less structurally stable. Additionally, the gate material 128 may be deposited at a greater thickness in the gates 129 because sidewall protection is not utilized. Furthermore, the gates 129 on either side of a particular fin 130 may be effectively isolated. In addition, the reticle used to form the pattern in the materials overlying the substrate 102 may be the same reticle used in the processes described in U.S. Pat. No. 7,098,105 and United States Patent Application Publication No. 2006/0046407. As such, new reticles do not have to be fabricated to conduct the process described above.

Figure 9:
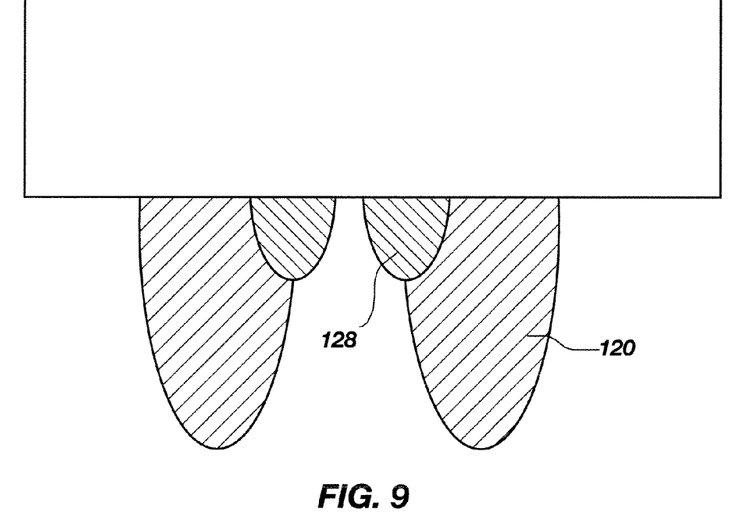

An additional advantage of the above-mentioned process is that the process may prevent sliver formation between the first trench 116" (isolation trench) and the second trench 122' (RAD trench) by increasing overlap between the first trench 116" and the second trench 122'. As previously described, by undercutting the substrate 102 (shown in FIG. 4 by the dashed lines), the first trench 116" and the second trench 122' may overlap during subsequent processing, preventing a sliver of silicon from forming between the trenches 116", 122'. As such, when the first trench 116" (isolation trench) and the second trench 122' (RAD trench) are filled with fill material 120 and gate material 128, respectively, as shown in FIG. 9, at least a portion of the fill material 120 and gate material 128 in the respective trenches overlaps.

Figure 10:
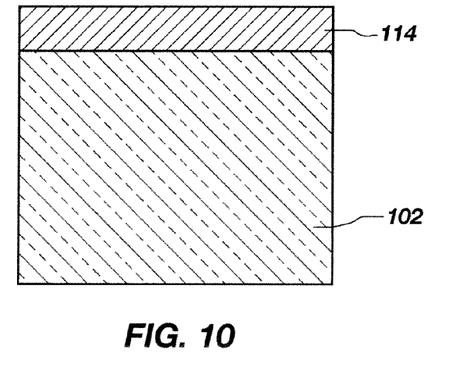
FIGS. 10-18 are cross-sectional views of embodiments of semiconductor structures of the present invention during various stages of fabrication.
Figure 11:
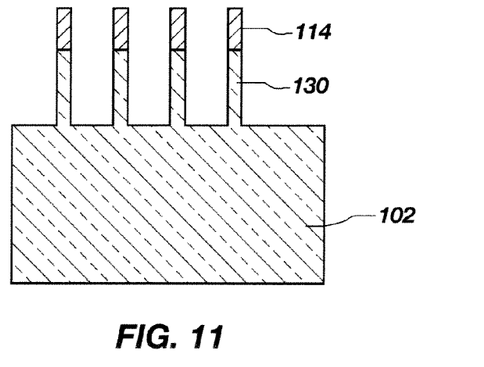

In another embodiment, improved physical isolation between gates 129 of semiconductor structure 134B (see FIG. 18) is achieved by extending the $L_{effective}$ and increasing the field gate oxide so that $V_t$ may be increased above the operating voltage. The isolation between the gates 129 may be achieved without utilizing a second photolithography or masking act, which provides significant cost savings. In addition, self-aligned features may be formed. To form the semiconductor structure 134B (see FIG. 18), a substrate 102 having a hard mask material 114 overlying an upper surface of the substrate 102 may be provided, as illustrated in FIG. 10. The hard mask material 114 may be a nitride, such as $Si_3N_4$, and may be deposited on the substrate 102 by conventional techniques. The hard mask material 114 may be formed over the substrate 102 by conventional techniques. A photoresist material (not shown) may be deposited over the hard mask material 114, patterned, and developed by conventional, photolithographic techniques. To produce the pattern in the substrate 102 shown in FIG. 11, a reticle (not shown) having a corresponding pattern may be produced and used to pattern the photoresist material, as known in the art. Since photoresist materials and photolithographic techniques are known in the art, selecting, depositing, patterning, and developing the photoresist material to produce the pattern are not discussed in detail herein. The pattern in the photoresist material may be transferred to the hard mask material 114 and substrate 102, producing a pattern of lines and spaces having equal widths in the substrate 102. By way of non-limiting example, the lines may have a width of F or F/2. The lines of the pattern may form fins 130 in the substrate 102. The fins 130 may have portions of the hard mask material 114 remaining thereover. The fins 130 may be created using a conventional dry etch chemistry, such as a hydrogen bromide ("HBr")-based chemistry.

Figure 12:
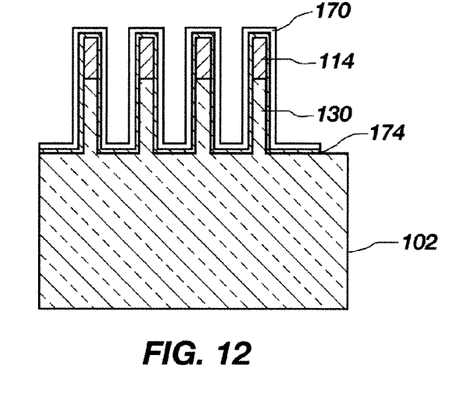

As shown in FIG. 12, a sacrificial material 170 may be conformally deposited over the fins 130. Before depositing the sacrificial material 170, a sacrificial oxide material 174 may, optionally, be conformally deposited over the fins 130. If present, the sacrificial oxide material 174 may provide an improved interface between the substrate 102 and the sacrificial material 170. The sacrificial material 170 may be deposited by ALD or other conformal deposition technique. The material used as the sacrificial material 170 may be selected based on its etch characteristics relative to the etch characteristics of other exposed materials, such as exposed oxide materials. The sacrificial material 170 may be selectively etchable relative to other exposed materials. As used herein, a material is "selectively etchable" when the material exhibits an etch rate of at least approximately 2 times greater than that of another material exposed to the same etch chemistry. Ideally, such a material has an etch rate of at least approximately 10 times greater than that of another material exposed to the same etch chemistry. The sacrificial material 170 may be a low-cost, low-quality material having the desired etch selectivity. As used herein, the term "low quality" means and includes a suitable material having impurities. The sacrificial material 170 may include carbon impurities, which contribute to its etch selectivity relative to other exposed materials. Since the sacrificial material 170 is not present in the semiconductor structure 134B (see FIG. 18), the presence of such impurities in the sacrificial material 170 is not detrimental to operation of a semiconductor device that includes the semiconductor structure 134B. The sacrificial material 170 may be a low density oxide having a low deposition temperature. The deposition temperature of the sacrificial material 170 may range from approximately 50° C. to approximately 150° C., such as approximately 75° C. By way of non-limiting example, the sacrificial material 170 is $SiO_2$ and is deposited by ALD. By controlling the deposition technique and the deposition temperature of the sacrificial material 170, the sacrificial material 170 having the desired etch selectivity may be formed over the fins 130. The low deposition temperature and low density of the deposited sacrificial material 170 and the presence of impurities in the sacrificial material 170 enable the sacrificial material 170 to be removed at a faster rate than other exposed oxide materials. The thickness at which the sacrificial material 170 is deposited may be approximately equal to the width of gates 129 ultimately formed in the semiconductor structure 134B (see FIG. 18). By way of non-limiting example, the sacrificial material 170 is deposited over the fins 130 by ALD at a thickness of F/2.

Figure 13:
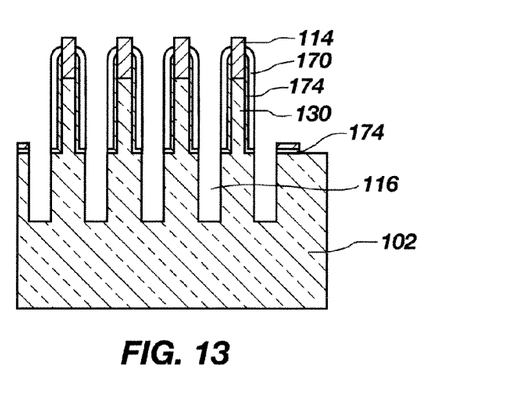

The sacrificial material 170 may protect sidewalls of the fins 130, provide self-alignment, and function as a hard mask during subsequent etch of the substrate 102. As illustrated in FIG. 13, the sacrificial material 170 may be used as a hard mask to etch a first trench 116 (or isolation trench) in the substrate 102. The first trench 116 may be formed between adjacent fins 130, separating the fins 130. To form the first trench 116, the sacrificial material 170, sacrificial oxide material 174 (if present), and substrate 102 may be etched using a conventional dry plasma etch, such as an $HBr/Cl_2$ plasma etch or a fluorocarbon plasma etch. Alternatively, the sacrificial material 170 and the sacrificial oxide material 174 (if present) may be etched separately from the substrate 102 using conventional dry plasma etches. The depth of the first trench 116 may depend on the features to be formed in the first trench 116 and on requirements for physically isolating gates 129 (see FIG. 18) formed on the substrate 102. The depth of the first trench 116 may be selected by a person of ordinary skill in the art and may be achieved by appropriately adjusting the etch conditions, as known in the art. While the dry plasma etch may remove portions of the substrate 102 and the sacrificial material 170, vertical portions of the sacrificial material 170 may remain on the sidewalls of the fins 130, as shown in FIG. 13. As described below, the sacrificial material 170 may be removed during subsequent processing to form second trench 122.

Figure 14:
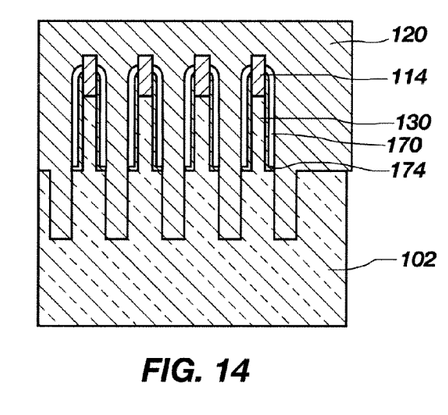

The first trench 116 may be filled with fill material 120, as shown in FIG. 14. The fill material 120 may also extend above the fins 130. The fill material 120 may be a dielectric material having different etch characteristics than the sacrificial material 170. As such, the sacrificial material 170 may be selectively etched relative to the fill material 120. The fill material 120 may be a high quality, high density, oxide material including, but not limited to, TEOS. As used herein, the term "high quality" means and includes a material substantially free of impurities. By way of non-limiting example, the fill material 120 may be TEOS deposited by the Applied Producer High Aspect Ratio Process ("HARP"), which is commercially available from Applied Materials, Inc. (Santa Clara, Calif.). The oxide material may be deposited at a higher temperature than the sacrificial material 170.

Figure 15:
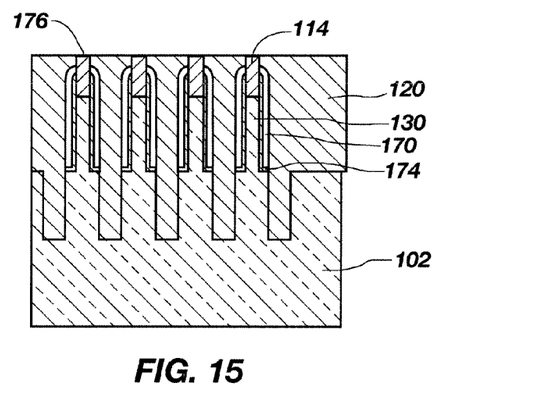
Figure 16:
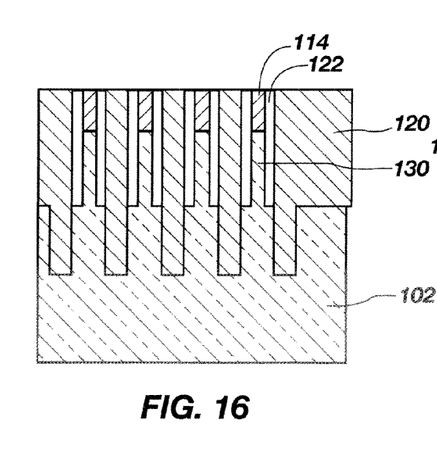

As shown in FIG. 15, the fill material 120 may be planarized, such as by CMP, to expose an upper surface 176 of the hard mask material 114. In addition to removing portions of the fill material 120, the planarization may also remove portions of the sacrificial material 170 overlying the hard mask material 114. The sacrificial material 170 and sacrificial oxide material 174 (if present) remaining on sidewalls of the fins 130 may be selectively removed, forming second trench 122 (or RAD trench) adjacent to the fins 130, as shown in FIG. 16. The sacrificial material 170 may be removed using a dry etch chemistry or a wet etch chemistry selective for the sacrificial material 170 relative to the fill material 120 and the hard mask material 114. As such, the fill material 120 in the first trench 116 may remain substantially intact. The etch chemistry may have a selectivity for the sacrificial material 170 relative to the fill material 120 of greater than approximately 20:1, such as greater than approximately 100:1. By way of non-limiting example, a dilute solution of HF may be used to selectively remove the sacrificial material 170. However, other conventional etch chemistries having the desired selectivity may also be used. By utilizing the difference in etch characteristics between the sacrificial material 170 and the fill material 120, the fill material 120 may remain in the first trench 116 while the sacrificial material 170 is removed.

Figure 17:
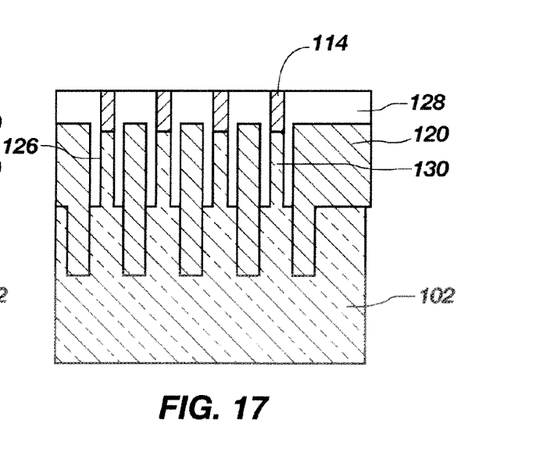
Figure 18:
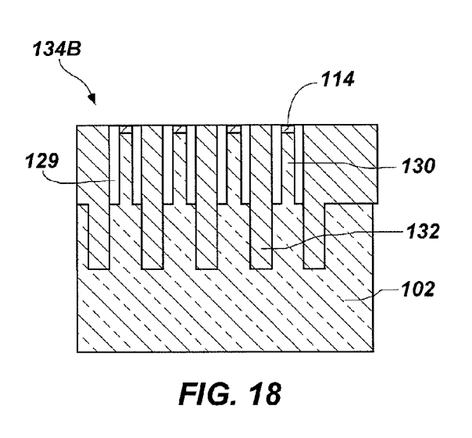

A gate oxide 126 may be grown in the second trench 122 and a gate material 128 deposited over the gate oxide 126 by conventional techniques, as shown in FIG. 17. A portion of the gate material 128 extending above a top surface of the fill material 120 may be removed, as shown in FIG. 18, producing semiconductor structure 134B having gates 129 and isolation oxide regions 132. The portion of the gate material 128 may be removed by conventional techniques, such as by CMP, to expose the top surface of the hard mask material 114. The gate material 128 may be further recessed to a desired depth using a conventional wet etch or dry etch process. The resulting gates 129 may be effectively isolated from one another by the isolation oxide regions 132. The $L_{effective}$ of the gates 129 formed as described above may be approximately 4 or approximately 5 times longer than that of conventional gates. The semiconductor structure 134B may be subjected to additional processing to produce the desired memory device. Such processing is known in the art and, therefore, is not described in detail herein. By way of non-limiting example, the semiconductor structure 134B may be used in a damascene process. Damascene processes are known in the art, and, therefore, are not discussed in detail herein. During the subsequent processing, the hard mask material 114 remaining over the fins 130 may be removed, at which point the semiconductor structure 134B may be substantially identical to the semiconductor structure 134A.

Figure 19:
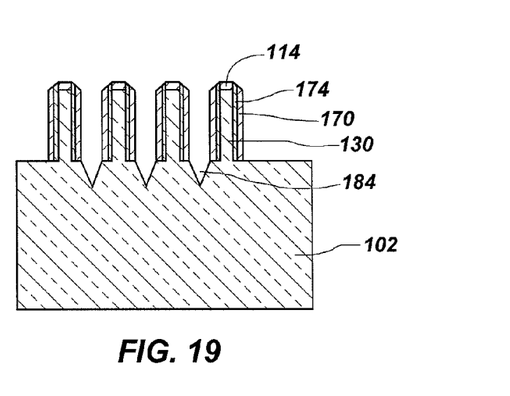
FIGS. 19-21 are cross-sectional views of embodiments of semiconductor structures of the present invention during various stages of fabrication.

In yet another embodiment, improved physical isolation between gates (not shown) formed from gate material 128 of semiconductor structure 134D (see FIG. 21) may be achieved by forming a V-shaped trench 184 (see FIG. 19) in the substrate 102. As such, the $L_{effective}$ and field gate oxide of the gates may be increased. The isolation between the gates may be achieved without utilizing a second photolithography or masking act, which provides significant cost savings to the process. In addition, self-aligned features may also be formed. In this embodiment, the fins 130 may be formed in the substrate 102, and the sacrificial oxide material 174 (if present) and the sacrificial material 170 conformally deposited over the fins 130, as previously described and illustrated in FIGS. 10-12. The sacrificial material 170 may be used as a hard mask to form the V-shaped trench 184 in the substrate 102, as illustrated in FIG. 19. The V-shaped trench 184 may have substantially sloped sidewalls. In contrast, the first trench 116 described above and shown in FIG. 13 may have substantially vertical sidewalls. The V-shaped trench 184 may be formed by etching the sacrificial material 170, the sacrificial oxide material 174 (if present), and the substrate 102 using a conventional dry plasma etch, such as a $HBr/Cl_2$ plasma etch or a fluorocarbon plasma etch. Alternatively, the sacrificial material 170 and the sacrificial oxide material 174 (if present) may be etched separately from the substrate 102 using conventional dry plasma etches. While the sacrificial material 170 remaining over the fins 130 is shown in FIG. 19 as having rounded corners, the corners of the sacrificial material 170 may be square, as previously mentioned. The so-called "V-shape" of the V-shaped trench 184 may be produced by controlling the etch conditions, as known in the art, such as the etch chemistry, flow, temperature pressure, bias, or orientation of the substrate 102. The depth of the V-shaped trench 184 may depend on the feature to be formed in the V-shaped trench 184 and on requirements for physically isolating gates formed from the gate material 128 (see FIG. 17). The desired depth of the V-shaped trench 184 may be selected by a person of ordinary skill in the art and may be achieved by appropriately adjusting the etch conditions, as known in the art.

Figure 20:
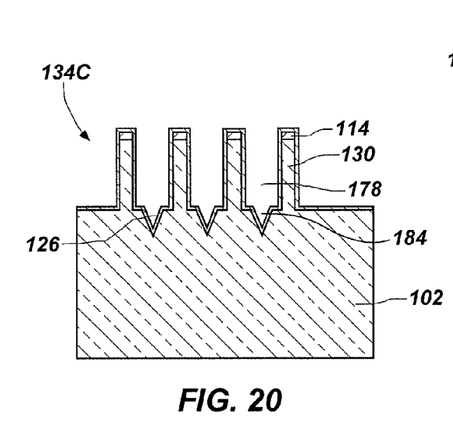
Figure 21:
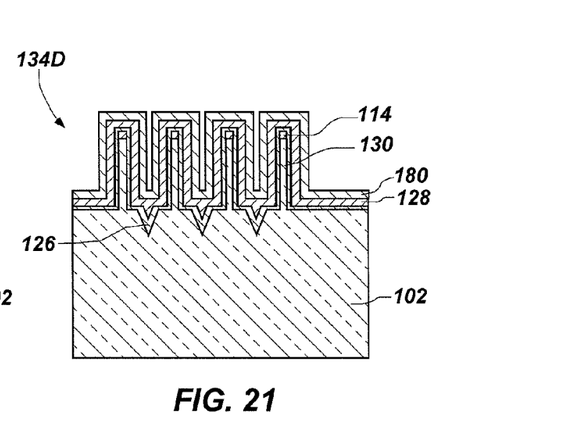

After forming the V-shaped trench 184, the sacrificial material 170 and the sacrificial oxide material 174 (if present) may be removed, as shown in FIG. 20, exposing sidewalls of the fins 130. These materials may be removed by conventional techniques, such as by using a dry etch chemistry or a wet etch chemistry selective for the sacrificial material 170 relative to the substrate 102 and the hard mask material 114. The V-shaped trench 184 may subsequently be filled, such as with gate oxide 126, forming semiconductor structure 134C. While the gate oxide 126 may substantially fill the V-shaped trench 184, spaces 178 between the fins 130 may remain substantially free of the gate oxide 126. Gate material 128 may then be conformally deposited over the fins 130, as shown in FIG. 21. An additional sacrificial material 180 may be formed over the gate material 128, forming semiconductor structure 134D. Since the V-shaped trench 184 is filled with the gate oxide 126, the gate material 128 may be formed over the fins 130 and not in the V-shaped trench 184. By filling the V-shaped trench 184 with the gate oxide 126 before depositing the gate material 128, gates formed from the gate material 128 may be effectively isolated from one another after subsequent processing. The remainder of the processing acts to produce the gates may be conducted as described in U.S. Pat. No. 7,098,105 and United States Patent Application Publication No. 2006/0046407. The $L_{effective}$ of the gates formed as described above may be approximately 4 or approximately 5 times longer than that of conventional gates.

While the invention may be susceptible to various modifications as well as alternative forms and implementations, specific embodiments have been shown by way of example in the drawings and have been described in detail herein. However, it should be understood that the invention is not limited to the particular embodiments disclosed. Rather, the invention encompasses all modifications, equivalents, and alternatives falling within the scope of the invention as defined by the following appended claims and their legal equivalents.

What is claimed is:

1. A method of isolating gates in a semiconductor structure, comprising: forming a plurality of first trenches through a plurality of materials overlying a substrate, the plurality of materials comprising a nitride material, an oxide pillar material, an etch stop material, and a polysilicon material; forming a spacer material on sidewalls of the plurality of the first trenches and overlying the nitride material, the oxide pillar material, the etch stop material, and the polysilicon material; extending the plurality of the first trenches at least partially into the substrate to form a plurality of isolation trenches, the spacer material remaining on the sidewalls of the plurality of the first trenches adjacent to the polysilicon material, the etch stop material, the oxide pillar material, and the nitride material; filling the plurality of isolation trenches with a fill material; removing the spacer material to form a gap adjacent to vertical edges of the polysilicon material, the etch stop material, the oxide pillar material, and the nitride material; enlarging the gap by removing the polysilicon material and the etch stop material and a portion of the oxide pillar material to form a plurality of second trenches and a plurality of oxide pillars; and extending the plurality of the second trenches into the substrate to form a plurality of recessed access device trenches.

2. The method of claim 1, wherein forming the plurality of the first trenches through the plurality of materials overlying the substrate comprises producing the plurality of the first trenches comprising substantially vertical sidewalls in the polysilicon material, the etch stop material, and the oxide pillar material.

3. The method of claim 1, wherein forming the plurality of the first trenches through the plurality of materials overlying the substrate comprises forming the plurality of the first trenches having a minimum feature size of F.

4. The method of claim 1, wherein forming the spacer material on the sidewalls of the plurality of the first trenches comprises reducing a width of the plurality of the first trenches to F/2.

5. The method of claim 1, wherein extending the plurality of the first trenches at least partially into the substrate to form a plurality of isolation trenches further comprises undercutting portions of an upper surface of the substrate.

6. The method of claim 1, wherein extending the plurality of the first trenches at least partially into the substrate to form a plurality of isolation trenches comprises forming the plurality of isolation trenches having substantially vertical sidewalls.

7. The method of claim 6, wherein extending the plurality of the first trenches at least partially into the substrate to form the plurality of the isolation trenches comprises forming the plurality of the isolation trenches having a width of F/2.

8. The method of claim 1, further comprising depositing a liner in the plurality of the isolation trenches.

9. The method of claim 1, wherein enlarging the gap by removing the polysilicon material and the etch stop material and a portion of the oxide pillar material to form a plurality of the second trenches and a plurality of oxide pillars comprises removing the polysilicon material and the etch stop material and laterally etching the oxide pillar material.

10. The method of claim 1, wherein extending the plurality of the second trenches into the substrate to form a plurality of recessed access device trenches comprises forming the plurality of the second trenches having substantially vertical sidewalls.

11. The method of claim 1, wherein extending the plurality of the second trenches into the substrate to form a plurality of recessed access device trenches comprises using the plurality of the oxide pillars as a hard mask to form the plurality of the recessed access device trenches.

12. The method of claim 1, further comprising filling the plurality of the recessed access device trenches with a gate material and removing the plurality of the oxide pillars from the substrate.

\* \* \* \* \*